(12) United States Patent
Yeh

(10) Patent No.: US 7,495,480 B2
(45) Date of Patent: Feb. 24, 2009

(54) REFERENCE VOLTAGE DRIVING CIRCUIT WITH A COMPENSATING CIRCUIT

(75) Inventor: Shin-Hung Yeh, Taipei (TW)

(73) Assignee: AU Optronics Corp, Hsinchu (TW)

( * ) Notice: Subject to any disclaimer, the term of this patent is extended or adjusted under 35 U.S.C. 154(b) by 0 days.

(21) Appl. No.: 11/802,942

(22) Filed: May 29, 2007

(65) Prior Publication Data
US 2007/0229136 A1 Oct. 4, 2007

Related U.S. Application Data

(63) Continuation of application No. 11/120,974, filed on May 4, 2005, now Pat. No. 7,253,664.

(30) Foreign Application Priority Data
Sep. 3, 2004 (TW) .............................. 93126780 A

(51) Int. Cl.
G11C 27/02 (2006.01)
(52) U.S. Cl. ......................................... 327/96; 341/120
(58) Field of Classification Search ............. 327/91–96, 327/337, 554; 341/118, 120
See application file for complete search history.

(56) References Cited

U.S. PATENT DOCUMENTS

| | | | | |
|---|---|---|---|---|
| 4,400,637 A * | 8/1983 | Klar et al. | ..................... | 327/336 |
| 4,623,854 A * | 11/1986 | Kuraishi | ....................... | 333/173 |
| 5,142,238 A * | 8/1992 | White | ............................ | 330/9 |
| 5,469,164 A * | 11/1995 | Kemp | ........................... | 341/145 |
| 5,506,526 A * | 4/1996 | Seesink | ......................... | 327/91 |
| 5,894,284 A * | 4/1999 | Garrity et al. | ................ | 341/172 |
| 6,037,836 A * | 3/2000 | Yoshizawa | ..................... | 330/9 |
| 6,133,863 A * | 10/2000 | Peng | ............................ | 341/120 |
| 6,222,471 B1* | 4/2001 | Nagaraj | ........................ | 341/120 |
| 6,369,740 B1* | 4/2002 | Swanson | ...................... | 341/155 |
| 6,617,838 B1* | 9/2003 | Miranda et al. | ........... | 324/117 R |
| 6,618,579 B1* | 9/2003 | Smith et al. | .................. | 455/307 |
| 6,642,866 B2* | 11/2003 | Kuo et al. | ...................... | 341/118 |
| 6,778,121 B2* | 8/2004 | Manganaro | .................. | 341/150 |
| 2003/0099233 A1* | 5/2003 | Bae et al. | ...................... | 370/389 |
| 2005/0052309 A1* | 3/2005 | Wang | .......................... | 341/172 |

* cited by examiner

*Primary Examiner*—Donovan Lincoln
*Assistant Examiner*—Thomas J Hiltunen
(74) *Attorney, Agent, or Firm*—Thomas, Kayden, Hostemeyer & Risley

(57) ABSTRACT

A compensating circuit for calibrating reference voltage, which is coupled to an operation amplifier having an input end and an output end within a reference voltage driving circuit, is provided in the present invention. The compensating circuit comprises a first capacitor, a second capacitor, and a first switch. The first capacitor is utilized for storing the potential with respect to the reference voltage. The second capacitor is coupled to the operation amplifier for storing the potential difference between the input end and the output end of the operation amplifier. The first switch is electrically connecting to the first capacitor and the second capacitor. When turning on the first switch, the potentials stored in the first capacitor and the second capacitor are combined and input to the operation amplifier to have an output voltage level substantially identical to the reference voltage.

12 Claims, 6 Drawing Sheets

… (1)

REFERENCE VOLTAGE DRIVING CIRCUIT WITH A COMPENSATING CIRCUIT

CROSS REFERENCE OF RELATED APPLICATIONS

This application is a Continuation of U.S. Ser. No. 11/120,974, issued as U.S. Pat. No. 7,253,664, entitled "REFERENCE VOLTAGE DRIVING CIRCUIT WITH A COMPENSATING CIRCUIT AND A COMPENSATING METHOD OF THE SAME" and filed on May 4, 2005.

BACKGROUND OF THE INVENTION (1) Field of the Invention

This invention relates to a gray-scale reference voltage driving circuit for liquid crystal displays (LCDs), and more particularly, to a reference voltage driving circuit with a compensating circuit for calibrating reference voltage.

(2) Description of Related Art

Active matrix liquid crystal displays (AMLCDs) apply various electric fields to control the transparency of liquid crystal molecules for displaying images. As shown in FIG. 1A, a traditional AMLCD 1 includes a display panel 10 and a driving system 20. The display panel 10 has a pixel array 12. Each pixel device 120 of the pixel array 12 includes a liquid crystal capacitor 122 and a thin film transistor (TFT) 124. The liquid crystal capacitor 122 is composed of a pixel electrode, a common electrode, and a liquid crystal layer. The potential difference between the pixel electrode and the common electrode decides the transparency of the liquid crystal layer. The TFT 124 is electrically connected to the pixel electrode and utilized as a switch for selectably charging the pixel electrode.

The driving system 20 has a control circuit 22, a source driver 24, and a scanning driver 26. The control circuit 22 is utilized for applying digital displaying data DD and control signal CS to the source driver 24, and also applying scanning signal SS to the scanning driver 26. Also referring to FIG. 1B, the source driver 24 has a latch circuit 246, a plurality of digital to analog converters (DACs) 242, and a reference voltage driving circuit 244. The latch circuit 246 is utilized for latching the digital displaying data DD according to the scanning sequence defined by the control signal CS. The DACs 242 are utilized for transforming the latched displaying data into source driving voltage Vs. The source driving voltage Vs is then applied to the TFTs 124 of the pixel array 12 column by column through the data lines 32. The scan driver 26 is utilized for transforming the scanning signal SS into gate driving voltage Vg and applying the gate driving voltage Vg to turn on the TFTs 124 of the pixel array 12 row by row through the scanning lines 34.

Since the levels of the source driving voltage Vs decide the brightness of the pixel devices 120, in order to reduce the loss in the transformation between the digital display data DD and the display signals, the reference voltage driving circuit 244 within the source driver 24 must have accurate reference voltage values with respect to different gray-scale displaying brightness provided. Thus, the source driver 24 can transform the digital displaying data DD into the ideal source driving voltage Vs according to the reference voltage provided by the reference voltage driving circuit 244. On the contrary, as the mismatch of the reference voltage values provided by the reference voltage driving circuit 244 with respect to the ideal gamma curve exists, the accurate displaying images on the display panel 10 are not available.

Referring to FIG. 2, the reference voltage driving circuit (labeled 244 in FIG. 1B) has a resistor string composed of a plurality of resistors R0, R1, R2 ... Rk connected in a serial. The resistor string has a grounded end GND and a power supply end applied with a potential VCC. A plurality of output nodes P0, P1, P2 ... Pk is located between every neighboring resistors R0, R1, R2 ... Rk for providing reference voltages with various levels relative to different gray scales. Also referring to FIG. 1B, the reference voltages from the output nodes P0, P1, P2 ... Pk are applied to the DACs 242 directly. In addition, each DAC 242 electrically connected to output nodes P0, P1, P2 ... Pk of the resistor string results to a significant error of the reference voltages from the output nodes P0, P1, P2 ... Pk.

In order to minimize the bad influence from the DACs 242, a plurality of negative feedback operation amplifiers OA0, OA1, OA2 ... OAk are electrically connected between the output nodes P0, P1, P2 ... Pk and the respecting DACs as a buffer.

However, the additional operation amplifiers OA0, OA1, OA2 ... OAk connecting to the resistor string may shift the potentials of the reference voltage provided from the output nodes P0, P1, P2 ... Pk. The reference voltage levels applied to the DACs 242 in reality, which are provided from the output end of the operation amplifiers OA0, OA1, OA2 ... OAk, are different from the preset voltage levels provided from the output nodes P0, P1, P2 ... Pk of the resistor string. For example, as shown in FIG. 3, assuming the operation amplifier OAi has a gain g and the reference voltage value provided from the resistor string is Vin, the reference voltage value Vout provided from the output end of the operation amplifier OAi equals to $Vin(g/(1+g))$ and a reference voltage error of $Vin(1/(1+g))$ is resulted because of the connected operation amplifier OAi.

Generally speaking, the reference voltage error can be reduced through increasing the gain g of the operation amplifier OAi. The gain g of the operation amplifier OAi is decided by the difference between the two potentials VDD and VSS applied thereto. However, the increasing of the difference between the two potentials VDD and VSS usually needs a higher voltage input and also an increased power consumption of the liquid crystal display panel.

In addition, attending with the development of the advance low temperature polysilicon (LTPS) fabrication technology, such as laser crystallization, forming polysilicon thin film transistors on the displaying panel to result the system on glass (SOG) liquid crystal display with reduced size and weight has become an important subject. However, the LTPS fabrication technology nowadays has a major drawback of poor uniformity, which usually leads to some uncertainty of the operation amplifiers formed on the glass substrate. Thus, as the reference voltage driving circuit 244 of FIG. 2 is formed on a glass substrate in such a manner, the reference voltage errors become unpredictable.

Accordingly, how to reduce the errors resulted by the negative feedback operation amplifiers connected with the resistor string and how to overcome the poor uniformity of the operation amplifiers formed by the LTPS fabrication technology have become important issues for circuit design in LCD industry.

SUMMARY OF THE INVENTION

A major object of the present invention is to provide a compensating circuit to reduce the reference voltage errors resulted by the connected operation amplifiers.

Another object of the present invention is to provide a compensating circuit focusing on the unpredictable errors resulted by the poor uniformity of the operation amplifiers formed on the glass substrate by using LTPS fabrication technology.

The compensating circuit for calibrating reference voltage provided in the present invention is coupled to an operation amplifier with an input end and an output end. The reference voltage is applied to the display panel through the operation amplifier. The compensating circuit comprises a first capacitor, a second capacitor, and a first switch. The first capacitor is utilized for storing the potential with respect to the reference voltage. The second capacitor is coupled to the operation amplifier for storing the potential difference between the input end and the output end of the operation amplifier. The first switch is electrically connecting to the first capacitor and the second capacitor. When turning on the first switch, the potentials stored in the first capacitor and the second capacitor are combined and input to the operation amplifier to have an output voltage level substantially identical to the reference voltage.

Reference will now be made in detail to the preferred embodiments of the present invention, examples of which are illustrated in the accompanying drawings. Wherever possible, the same reference numbers will be used throughout the drawings to refer to the same or like parts.

BRIEF DESCRIPTION OF THE DRAWINGS

The present invention will now be specified with reference to its preferred embodiment illustrated in the drawings, in which.

DETAIL DESCRIPTION OF THE PREFERRED EMBODIMENTS

Figure 4:
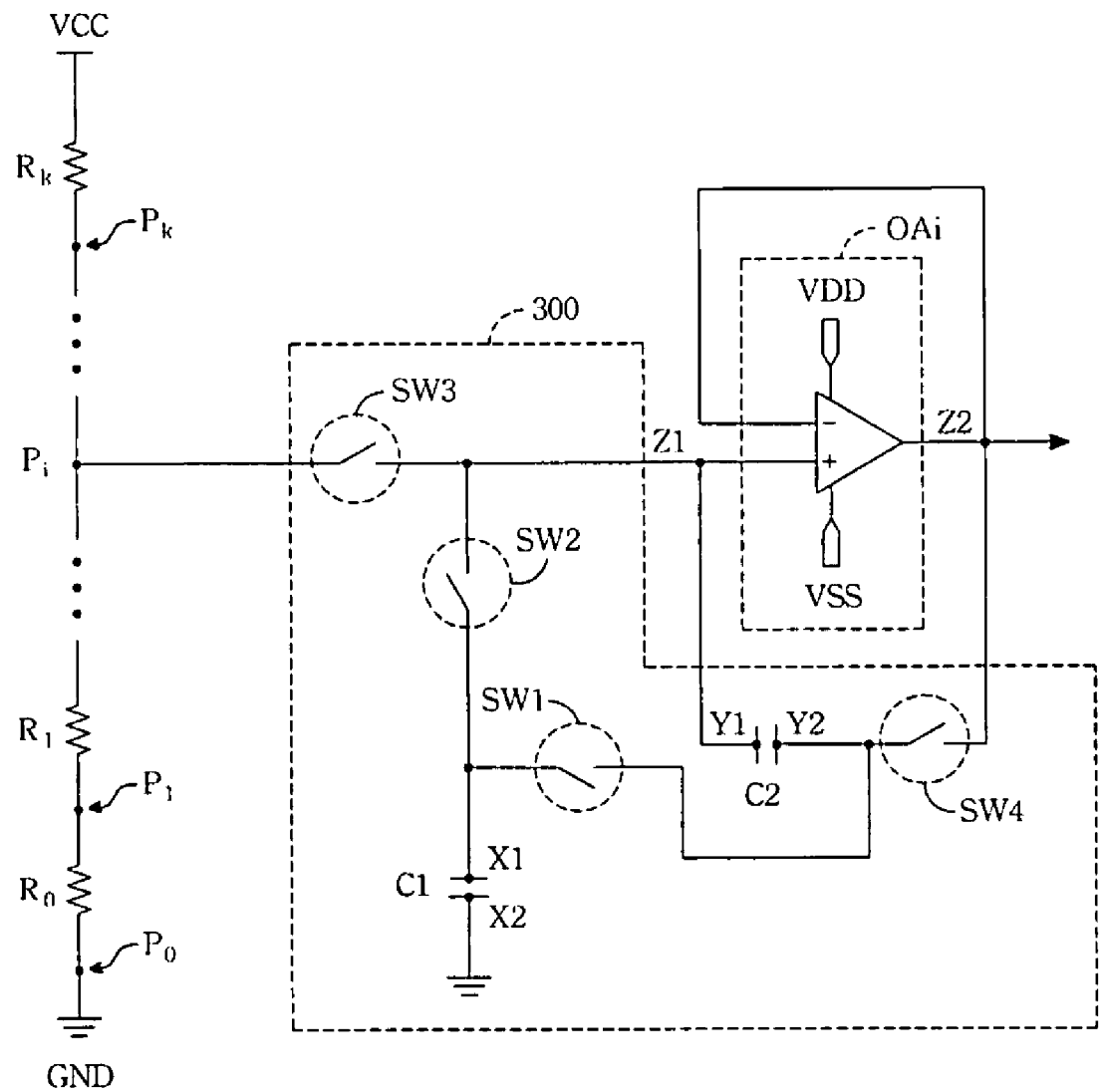
FIG. 4 depicts a circuit diagram showing a preferred embodiment of a reference voltage driving circuit of the present invention.

FIG. 4 shows a circuit diagram of a reference voltage driving circuit of the present invention. As shown, the reference voltage driving circuit includes a plurality of resistors $Ri$ (i=0 . . . k), a plurality of operation amplifiers $OAi$ (i=0 . . . k), and a plurality of compensating circuit 300 for calibrating reference voltage. The resistors $Ri$ (i=0 . . . k) are electrically connected in a serial at a plurality of output nodes $Pi$ (i=0 . . . k) to form a resistor string. One end of the resistor string is connected to a grounded end GND, and the other end is connected to a voltage source (not shown in this figure) for receiving a potential VCC. That is, the both ends of the resistor string are applied with different potentials to have various reference potentials respecting to difference grayscales output from the output nodes $Pi$ (i=0 . . . k) between the neighboring resistors $Ri$ (i=0 . . . k).

Figure 1A:
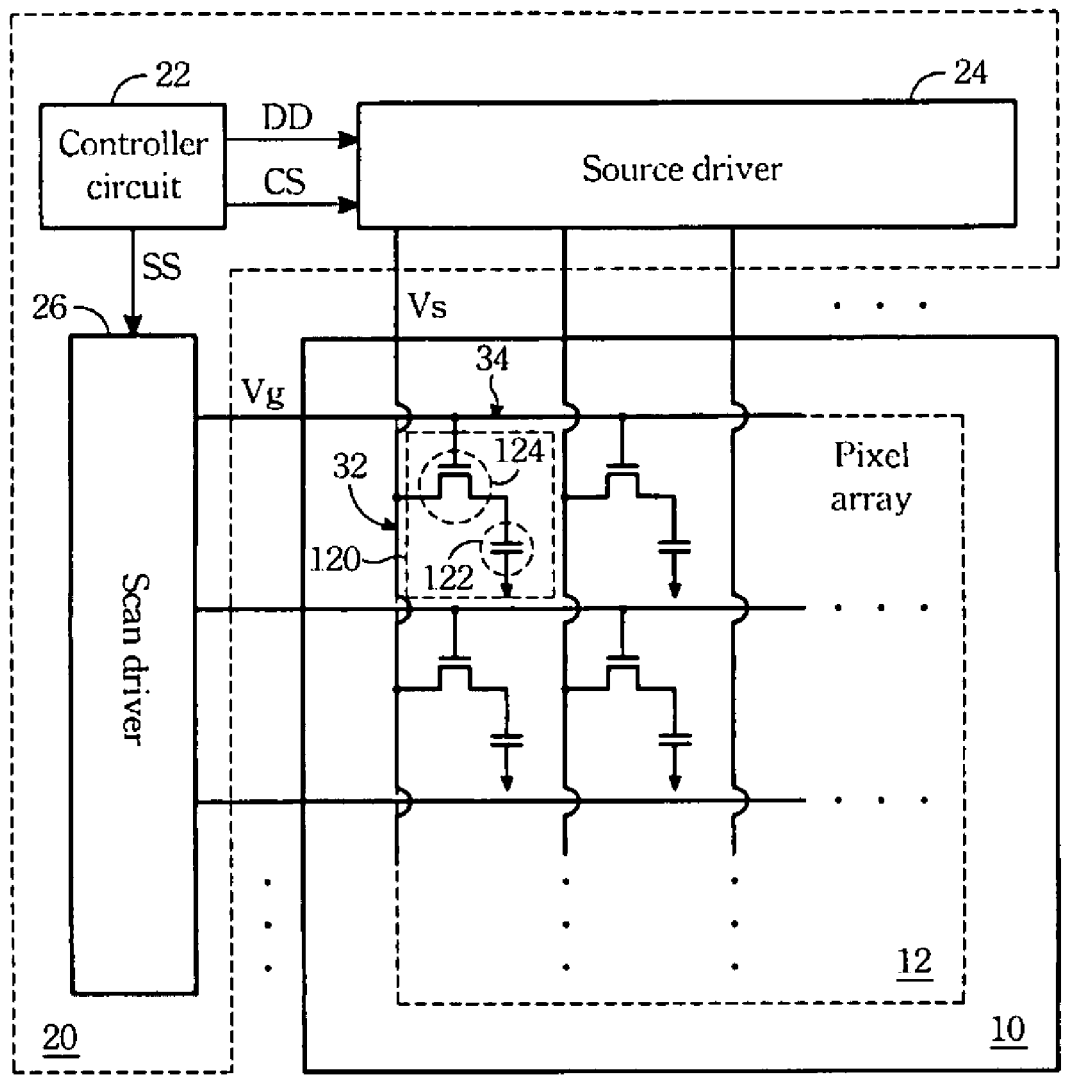
FIG. 1A depicts a block diagram showing a traditional active matrix liquid crystal display.
Figure 1B:
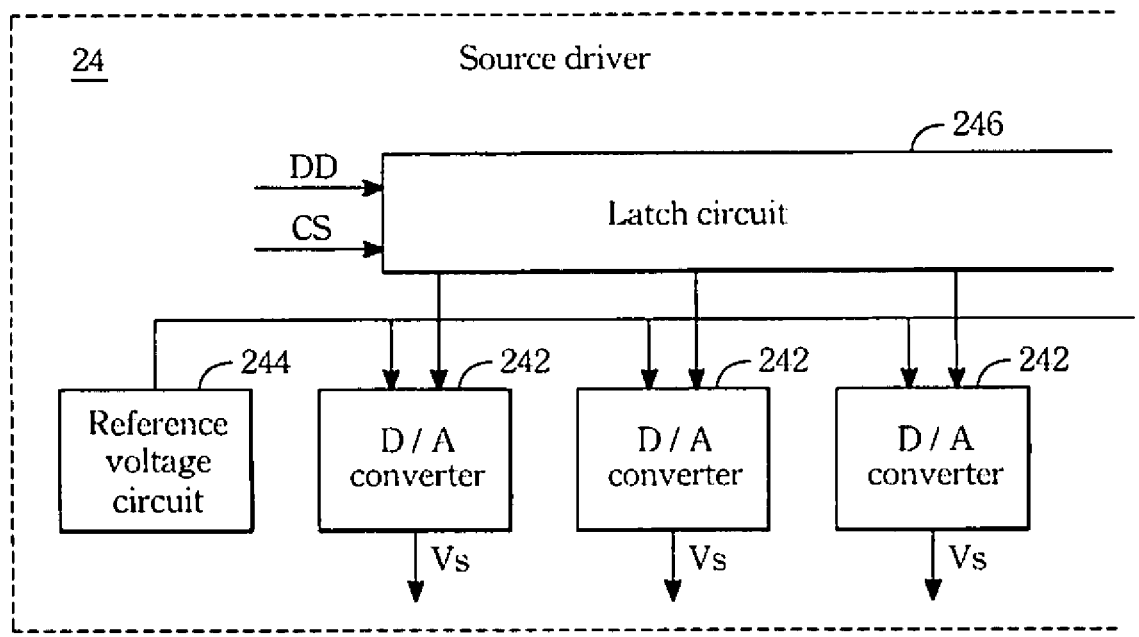
FIG. 1B depicts a block diagram showing a traditional source driver.

Each output node $Pi$ (i=0 . . . k) is electrically connected to an operation amplifier $OAi$ (i=0 . . . k) having negative feedback for buffering the influence from the DAC shown in FIG. 1B and isolating the reference voltage circuit 244 from the DACs.

Each compensating circuit 300 coupled to the respected operation amplifier $OAi$ (i=0 . . . k) includes a first capacitor C1, a second capacitor C2, a first switch SW1, a second switch SW2, a third switch SW3, and a fourth switch SW4. The first capacitor C1 has a first end X1 electrically connected to the respected output node $Pi$ on the resistor string and a second end X2 connected to the grounded GND. A potential provided from the output node $Pi$ (i=0 . . . k), which is identical to the potential of the input end Z1 of the operation amplifier $OAi$ (i=0 . . . k), is stored in the first capacitor C1. The second capacitor C2 having a first end Y1 electrically connected to the input end Z1 of the operation amplifier $OAi$ (i=0 . . . k) and a second end Y2 electrically connected to the output end Z2 of the operation amplifier $OAi$ (i=0 . . . k) is configured to store a potential difference between the input end Z1 and the output end Z2. That is, the second capacitor C2 is coupled to the operation amplifier $OAi$ (i=0 . . . k) in parallel.

The first switch SW1 has one end electrically connected to the first end X1 of the first capacitor C1 and has another end electrically connected to the second end Y2 of the second capacitor C2. Thus, the first switch SW1 is electrically coupled to the first capacitor C1 and the second capacitor C2, respectively. The third switch SW3 has one end electrically connected the respected output node $Pi$ (i=0 . . . k) and has another end electrically connected to the input end Z1 of the operation amplifier $OAi$ (i=0 . . . k) and the first end Y1 of the second capacitor C2. In other words, the third switch SW3 can be regarded as electrically coupled to the second capacitor C2 and the output node $Pi$ (i=0 . . . k), respectively, and also electrically coupled to the output node $Pi$ (i=0 . . . k) and the input end Z1 of the operation amplifier $OAi$ (i=0 . . . k), respectively.

The second switch SW2 has one end electrically connected to the first end X1 of the first capacitor C1 and has another end electrically connected to the circuit between the third switch SW3 and the input end Z1 of the operation amplifier $OAi$ (i=0 . . . k). That is, the second switch SW2 can be regarded as electrically coupled to the first capacitor C1 and the input end Z1 of the operation amplifier $OAi$ (i=0 . . . k), respectively, and also electrically coupled to the first capacitor C1 and the third switch SW3, respectively. The fourth switch SW4 has one end electrically connected to both the second end Y2 of the second capacitor C2 and the first switch SW1, and has another end electrically connected to the output end Z2 of the operation amplifier $OAi$ (i=0 . . . k). That is, the fourth switch SW4 is electrically coupled to the second capacitor C2 and the output end Z2 of the operation amplifier $OAi$ (i=0 . . . k), respectively.

Figure 5A:
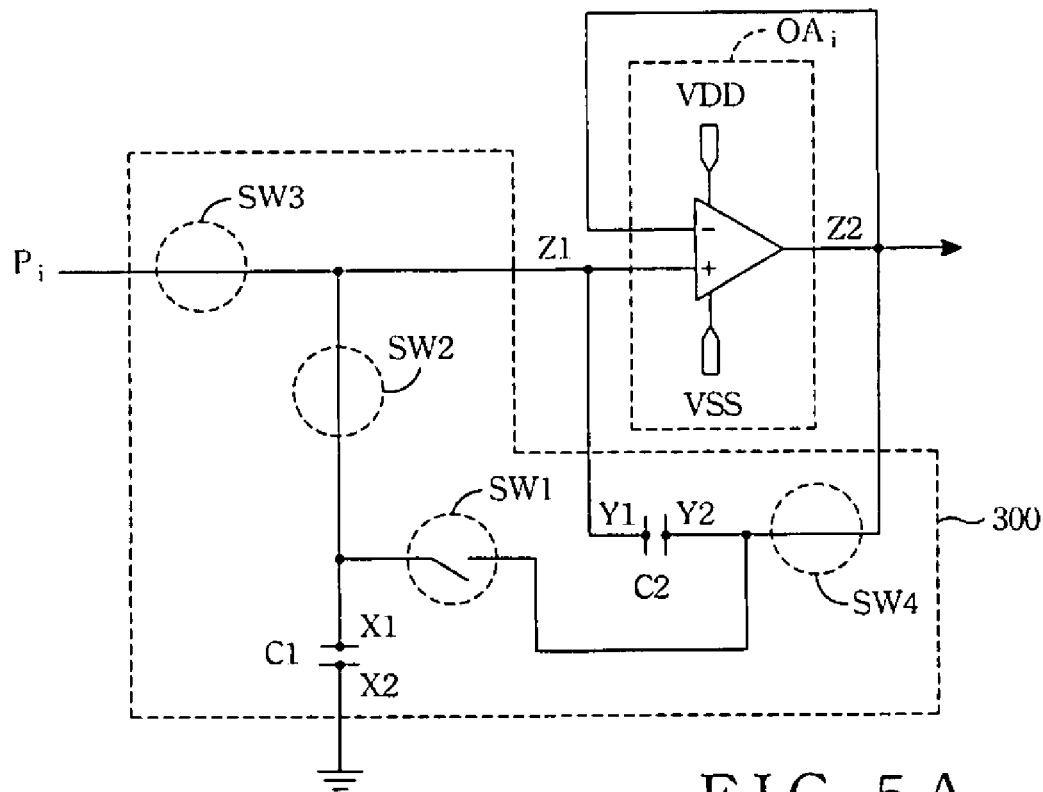
FIGS. 5A and 5B depict circuit diagrams as the compensating circuit shown in FIG. 4 is utilized to calibrate the reference voltage.
Figure 5B:
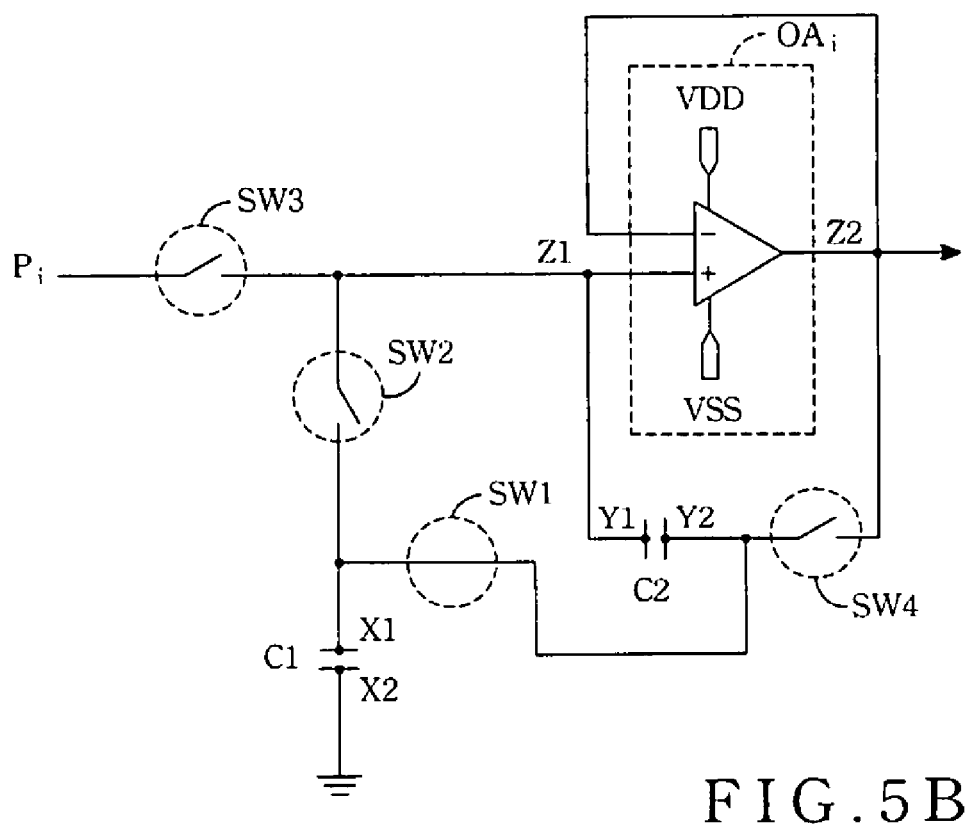

FIGS. 5A and 5B depict a preferred embodiment of the method using the compensating circuit of FIG. 4 to calibrate the reference voltage level from the output node $Pi$ (i=0 . . . k). Firstly, as shown in FIG. 5A, when turning off the first switch SW1, turning on the second switch SW2, and turning on the third switch SW3, the potential of the reference voltage is stored in the first capacitor C1. Simultaneously, when turning on the fourth switch SW4, the potential difference between the input end Z1 and the output end Z2 of the operation amplifier OAi (i=0 . . . k) is stored in the second capacitor C2.

Afterward, as shown in FIG. 5B, when turning off the third switch SW3 to break the circuit between the input end Z1 of the operation amplifier OAi (i=0 . . . k) and the output node Pi (i=0 . . . k), turning on the first switch SW1, turning off the second switch SW2, and turning off the fourth switch SW4, the potentials stored in the first capacitor C1 and the second capacitor C2 are combined and input to the operation amplifier OAi (i=0 . . . k). Thus, the original applied reference voltage from the output node Pi (i=0 . . . k) is replaced by the combination of the potentials stored in the first capacitor C1 and the second capacitor C2.

It should be noted that the potential applied to the operation amplifier OAi (i=0 . . . k), as shown in FIG. 5B, is substantially identical to the reference voltage level of the output node Pi (i=0 . . . k) plus the potential difference between the input end Z1 and the output end Z2 of the operation amplifier OAi (i=0 . . . k). Thus, the error generated between the input voltage Z1 and the output voltage Z2 of the operation amplifier OAi (i=0 . . . k) can be compensated through adjusting the input voltage level of the operation amplifier OAi (i=0 . . . k), so as to have the potential at the output end Z2 of the operation amplifier OAi (i=0 . . . k) substantially identical to the original reference voltage provided from the output node Pi.

Figure 6A:
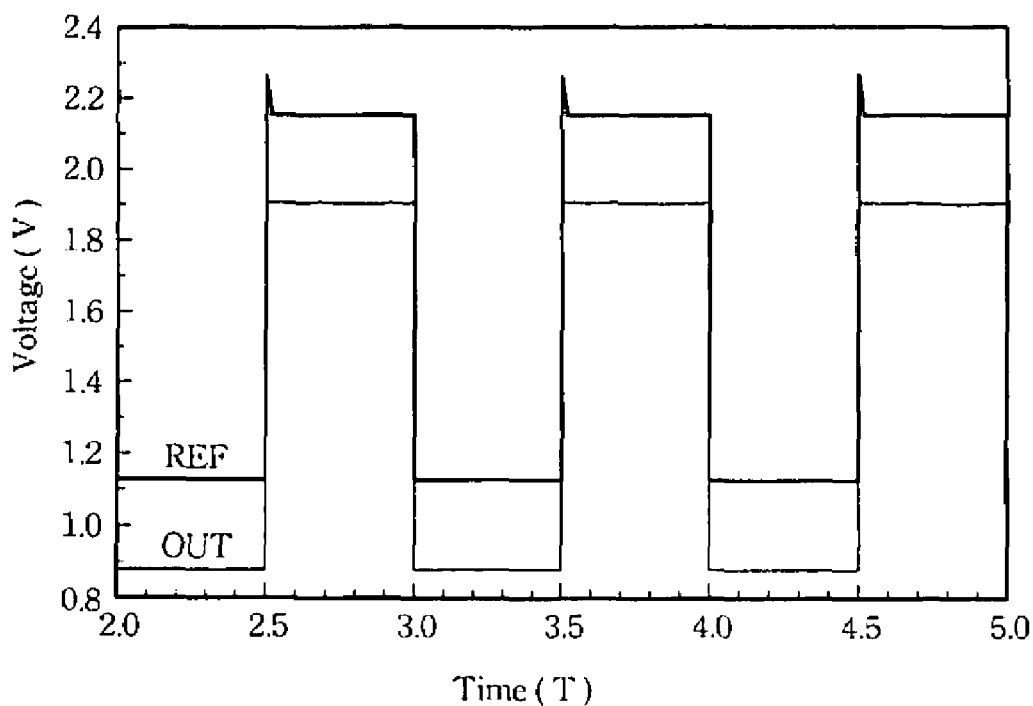
FIG. 6A depicts a waveform showing the output signal of the operation amplifier before the compensating circuit is utilized to calibrate the reference voltage of the present invention.
Figure 6B:
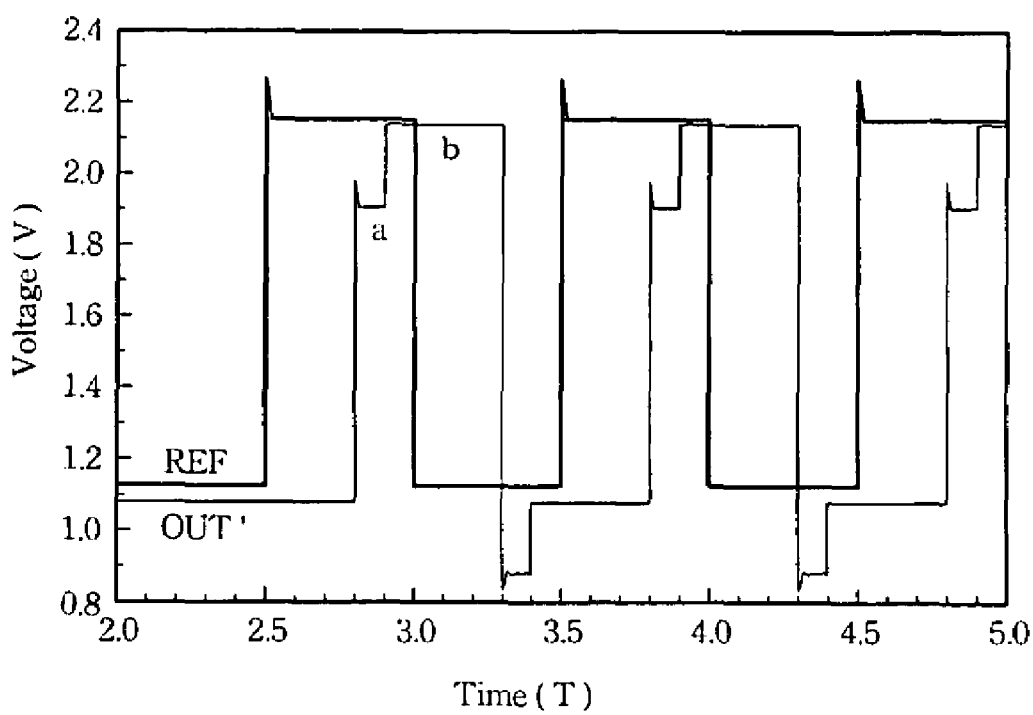
FIG. 6B depicts a waveform showing the output signal of the operation amplifier after the compensating circuit is utilized to calibrate the reference voltage of the present invention.

FIGS. 6A and 6B show the waveforms of the output reference voltage OUT from the output end Z2 of the operation amplifier OAi (i=0 . . . k) before and after the compensating circuit 300 of the present invention is activated. As shown in FIG. 6A, before the compensating circuit 300 is activated, the output reference voltage OUT shows a significant error with respect to the reference voltage provided from the output node REF. As mentioned above in the related prior art, the error may be resulted from the gain g of the operation amplifier OAi (i=0 . . . k) or the poor uniformity of the operation amplifier OAi (i=0 . . . k) because of the LTPS fabrication technology. Also referring to FIG. 5A, the error between the reference voltage REF and the output reference voltage OUT, which is represented to the potential difference between the input end Z1 and the output end Z2 of the operation amplifier OAi (i=0 . . . k), is stored in the second capacitor C2.

After the compensating circuit 300 is activated to calibrate the reference voltage REF as shown in FIG. 6B, the waveform of the output reference voltage OUT' from the output end Z2 of the operation amplifier OAi (i=0 . . . k) shows a front region a and a rear region b having different potentials corresponding to the circuits shown in FIGS. 5A and 5B, respectively. The potential of the front region a equals to the potential of the output reference voltage OUT before the compensating circuit 300 is activated as shown in FIG. 6A. The potential of the rear region b, which corresponds to the situation of FIG. 5B, is substantially identical to the potential of the reference voltage REF provided from the output node Pi (i=0 . . . k).

Figures 2, 3:
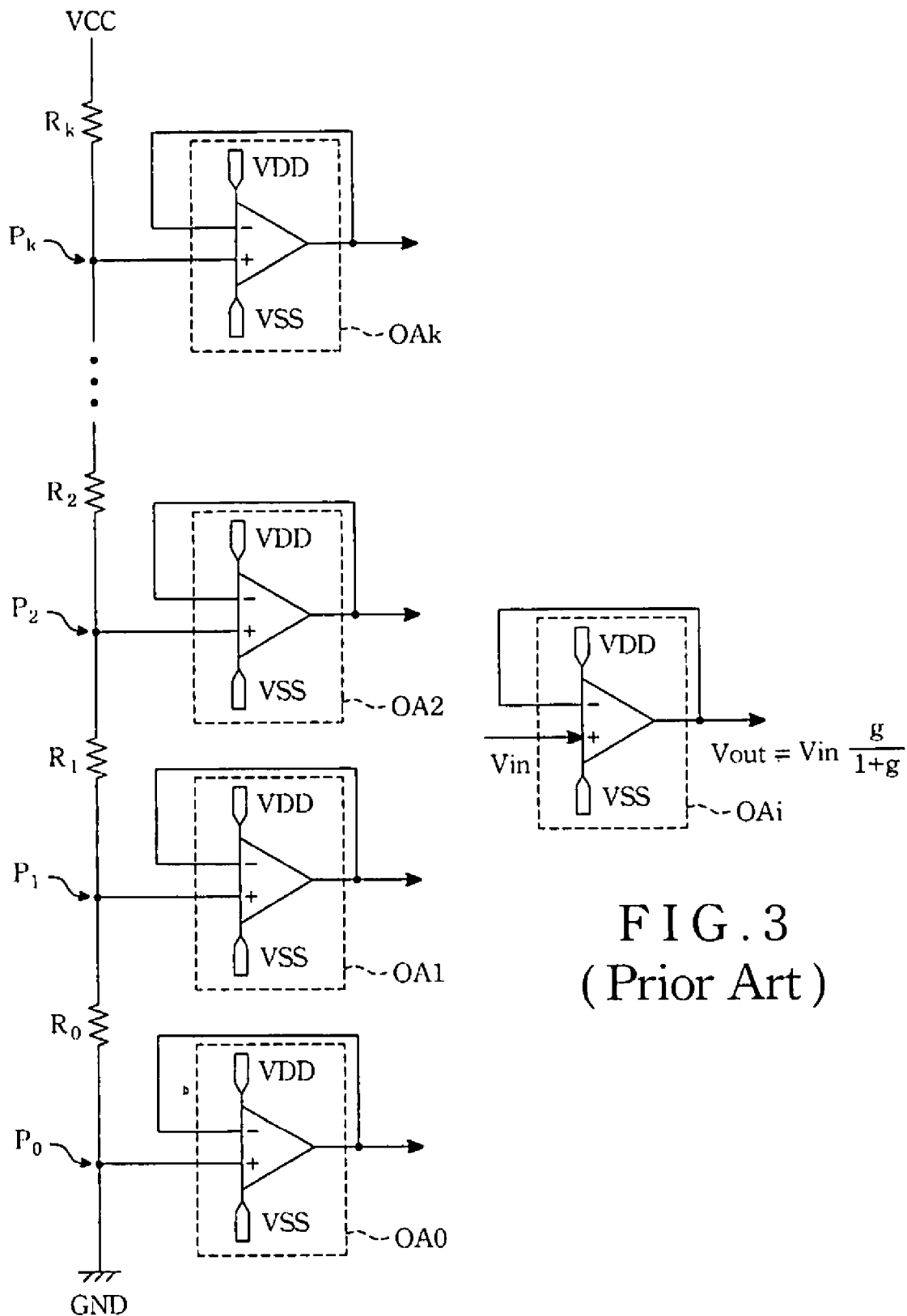
FIG. 2 depicts a circuit diagram showing a traditional reference voltage driving circuit.
FIG. 3 depicts an traditional operation amplifier with negative feedback, and the operation amplifier has a potential difference between the input end and the output end thereof.

It is understood that the reference voltage levels provided from the reference voltage driving circuit are set to be precisely matching the ideal gamma curve to make sure an accurate gray scale displaying. Under the present invention, the source driver shown in FIG. 2 may transform the displaying data DD to source driving voltage Vs according to. the potential of the rear region b of the output reference voltage OUT', which is substantially identical to the accurate reference voltage REF provided from the output node Pi (i=0 . . . k) and the errors from the operation amplifier OAi (i=0 . . . k) can be totally reduced.

By contrast to the traditional method, which needs an enormous gain of operation amplifiers to reduce the errors of the reference voltage, the compensating circuit 300 of the present invention feedbacks the potential difference crossing the operation amplifier OAi (i=0 . . . k) to the reference voltage directly. It is noted that the feedback event is unrelated to the value of the error and the gain of the operation amplifier OAi (i=0 . . . k). Thus, the compensating circuit 300 integrated to the operation amplifier OAi (i=0 . . . k) can be used for calibrating the reference voltage under low gain circumstance. In addition, the compensating method of the present invention also has the advantage of calibrating the operation amplifiers individually. Thus, the unpredictable error due to the poor uniformity of the operation amplifiers can be effectively reduced to make sure that the reference voltage driving circuit has an accurate reference voltage output.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A compensating circuit for calibrating reference voltage coupled to an operation amplifier having an input end with two input terminals and an output end, the compensating circuit connecting to the two input terminals comprising:
    a first capacitor for storing a potential of the reference voltage;
    a second capacitor coupled to the operation amplifier;
    a first switch electrically connected to the first capacitor and the second capacitor;
    a second switch having one end thereof electrically coupled to the first capacitor and another end thereof electrically coupled to the input end of the operation amplifier,
    a third switch electrically coupled to the second capacitor and the input end of the operation amplifier; and
    a fourth switch electrically coupled to the second capacitor and the output end of the operation amplifier,
    wherein when turning on the first switch and turning off the third switch and the fourth switch, the potentials stored in the first capacitor and the second capacitor, respectively, are combined and input to the operation amplifier.

2. The compensating circuit of claim 1, wherein the second capacitor is configured to store a potential difference between the input end and the output end of the operation amplifier.

3. The compensating circuit of claim 1, wherein when turning off the first switch and turning on the second switch, the potential of the reference voltage is stored in the first capacitor.

4. The compensating circuit of claim 3, wherein when turning on the first switch and turning off the second switch, the potentials stored in the first capacitor and the second capacitor, respectively, are combined and input to the operation amplifier.

5. The compensating circuit of claim 1, wherein when the potentials of the first capacitor and the second capacitor are combined and input to the operation amplifier, the operation amplifier generates an output voltage level substantially identical to the reference voltage.

6. A reference voltage driving circuit, comprising:
    two resistors electrically connected to each other at an output node;
    an operation amplifier, electrically coupled to the output node, having an input end with two input terminals and an output end;

a first capacitor, having one end thereof coupled to the output node and one of the input terminals, for storing a potential of the reference voltage;

a second capacitor coupled to the output end of the operation amplifier and one of the input terminals of the operation amplifier, and configured to store a potential difference between the input end and the output end of the operation amplifier;

a first switch electrically coupled to the first capacitor and the second capacitor; and a second switch, having one end thereof electrically coupled to the first capacitor, and having another end thereof electrically coupled to the input end of the operation amplifier and the output node.

7. The reference voltage driving circuit of claim 6, wherein the two resistors are connected in series between two different potentials.

8. The reference voltage driving circuit of claim 6, wherein when turning off the first switch and turning on the second switch, the potential of the reference voltage is stored in the first capacitor.

9. The reference voltage driving circuit of claim 8, wherein when turning on the first switch and turning off the second switch, the potentials stored in the first capacitor and the second capacitor, respectively, are combined and input to the operation amplifier.

10. The reference voltage driving circuit of claim 6, further comprising:

a third switch electrically coupled to the second capacitor and the input end of the operation amplifier; and a fourth switch electrically coupled to the second capacitor and the output end of the operation amplifier.

11. The reference voltage driving circuit of claim 10, when turn on the first switch, turn off the third switch and the fourth switch, the potentials stored in the first capacitor and the second capacitor are combined and input to the operation amplifier.

12. The reference voltage driving circuit of claim 6, wherein when the potentials stored in the first capacitor and the second capacitor are combined and input to the operation amplifier, the operation amplifier generates an output voltage level substantially identical to the reference voltage.

* * * * *